United States Patent
Sassa

Patent Number: 6,144,607
Date of Patent: Nov. 7, 2000

[54] MEMORY MANAGEMENT APPARATUS AND MEMORY MANAGEMENT METHOD

[75] Inventor: Akira Sassa, Saitama, Japan

[73] Assignee: Sony Corporation, Tokyo, Japan

[21] Appl. No.: 09/095,620

[22] Filed: Jun. 10, 1998

[30] Foreign Application Priority Data

Jun. 25, 1997 [JP] Japan .............................. P09-169199

[51] Int. Cl.$^7$ ..................................... G11C 8/00
[52] U.S. Cl. ................ 365/230.03; 365/218; 365/185.33
[58] Field of Search ................................... 395/712, 652, 395/430; 711/5; 365/235, 185.29, 230.03, 238.5, 218, 185.33

[56] References Cited

U.S. PATENT DOCUMENTS

| | | | |
|---|---|---|---|
| 5,479,638 | 12/1995 | Assar et al. | |
| 5,485,595 | 1/1996 | Assar et al. | |
| 5,603,001 | 2/1997 | Sukegawa et al. | 395/430 |
| 5,611,067 | 3/1997 | Okamoto et al. | 395/430 |
| 5,701,492 | 12/1997 | Wadaworth et al. | 395/712 |
| 5,805,882 | 9/1998 | Cooper et al. | 395/652 |
| 5,845,313 | 12/1998 | Estakhri et al. | |
| 5,890,188 | 3/1999 | Okamoto et al. | 711/5 |
| 5,924,113 | 7/1999 | Estakhri et al. | |

FOREIGN PATENT DOCUMENTS

6-266596 9/1994 Japan .
7-153284 6/1995 Japan .

*Primary Examiner*—David Nelms
*Assistant Examiner*—Thong Le
*Attorney, Agent, or Firm*—Frommer Lawrence & Haug, LLP.; William S. Frommer; Gordon Kessler

[57] ABSTRACT

The present invention enables a high-speed processing. The present invention provides a memory management method for a memory having a storage area divided into a plurality of blocks, so that a data in each of the blocks is erased at once when the block is initialized, wherein each of the blocks has a flag indicating a block use state; wherein when erasing a data written in a block, instead of executing an initialization of the block, an erase flag of the block is set to an erase state indicating that a data contained in the block is to be erased; and wherein prior to writing a new data in a block having the erase flag in the erase state, the initialization processing is executed to the block, setting the flag of the block to an initial state. It is preferable that each of the blocks be provided an end flag indicating whether the block is an end block containing an end portion of a data of a predetermined unit; and during a data write, the end flag of the block where an end portion of a data of a predetermined unit is written be set to a state indicating an end block.

8 Claims, 6 Drawing Sheets

MEMORY MANAGEMENT APPARATUS AND MEMORY MANAGEMENT METHOD

BACKGROUND OF THE INVENTION

1. Field of the Invention

The present invention relates to a memory management method and more particularly, to a memory management method using a flag indicating a state for each block, thus enabling high-speed processing.

2. Description of the Prior Art

Conventionally, for an electronic apparatus such as a computer as a main storage apparatus, a storage apparatus has been used to suffice the capacity of the main storage apparatus. As this storage apparatus, there can be exemplified a magnetic tape, magnetic disc, a magneto-optical disc, paper tape, memory card, and the like. Among them, the memory card has been widely used for its transfer rate of a comparatively high speed.

Moreover, the memory card is built in a still image pickup apparatus (so called still camera) and in a camera of a video tape recorder, so as to serve as a storage apparatus for storing a pickup information.

The memory card is constructed by storage means such as a semiconductor integrated circuit which is embedded in a frame, for example, made from a synthetic resin. The semiconductor integrated circuit is, for example a flash memory (electrically erasable programmable ROM (read only memory)).

It should be noted that in the aforementioned storage apparatus such as a memory card, management of a data stored there is carried out, for example, by way of distributed management method.

In the aforementioned distributed management method, a data stored in storage means (hereinafter, referred to as memory) of a storage apparatus is divided into a data erase unit such as a block, so as to create management information such as a block flag, logical address, and linkage information on block basis. Hereinafter, such a management information will be referred to as a distributed management information. In this distributed management method, when activating an electronic apparatus so as to read out and/or write into a data from/to the aforementioned storage apparatus, the electronic apparatus collects distributed management information on respective block in storage area of memory and reads out the information in storage means of the electronic apparatus, so as to create a central management table which enables to carry out an overall management of data of the blocks for carrying out the data management.

In a case when a flash memory is used as the memory of the memory card, normally, at a moment when a data of a predetermined block has become unnecessary, initialization on block basis is carried out, so as to erase the data written in the block all at once and this block enters a data writable state Consequently, for example, when a data in a predetermined block has become unnecessary and a data write is carried out into another block or a processing other than data write is carried out, the aforementioned processing is carried out after initialization of the predetermined block.

Such an initialization on block basis takes about 5 to 60 (msec) per block. If respective processing is carried out after this initialization is complete, a plenty of time is required for the entire processing, preventing increase of the processing speed.

SUMMARY OF THE INVENTION

It is therefore an object of the present invention to provide a memory management method and a memory management apparatus enabling to realize a high-speed processing as well as a recording medium in which this memory management method is applied.

In order to achieve the aforementioned object, the present invention is characterized by a memory management method for a memory having a storage area divided into a plurality of blocks, so that a data in each of the blocks is erased at once when the block is initialized, wherein each of the blocks has a flag indicating a block use state; wherein when erasing a data written in a block, instead of executing an initialization of the block, an erase flag of the block is set to an erase state indicating that a data contained in the block is to be erased; and wherein prior to writing a new data in a block having the erase flag in the erase state, the initialization processing is executed to the block, setting the flag of the block to an initial state.

In the aforementioned memory management method according to the present invention, it is preferable that during a data write to the respective blocks, the erase flag of each block in the initial state be set to a head in-use state indicating a storage of a head of a data of a predetermined unit or to an in-use state indicating storage of an intermediate portion of a data of a predetermined unit.

Moreover, in the aforementioned memory management method according to the present invention, it is preferable that each of the blocks be provided an end flag indicating whether the block is an end block containing an end portion of a data of a predetermined unit; and during a data write, the end flag of the block where an end portion of a data of a predetermined unit is written be set to a state indicating an end block.

In the memory management method according to the present invention, each of the blocks of the storage area of the memory is provided with a flag indicating the block use state. For example, when executing a processing other than initialization to a block containing a data which has become unnecessary, instead of initializing the block, the erase flag provided for this block is firstly set to an erase state indicating that the data contained in this block is to be erased. In this state, the processing other than initialization of the block is executed, and prior to a data write into a block having the erase flag in the erase state, the initialization processing is executed to this block, setting the flag of the block to an initial state. Thus, it is possible to execute various processing without waiting for completion of the initialization processing which requires a plenty of time.

DETAILED DESCRIPTION OF PREFERRED EMBODIMENTS

Hereinafter, description will be directed to embodiments of the present invention with reference to the attached drawings. It should be noted that the description is based on a case when the present invention is applied to a memory management method of a memory card.

Figure 1:
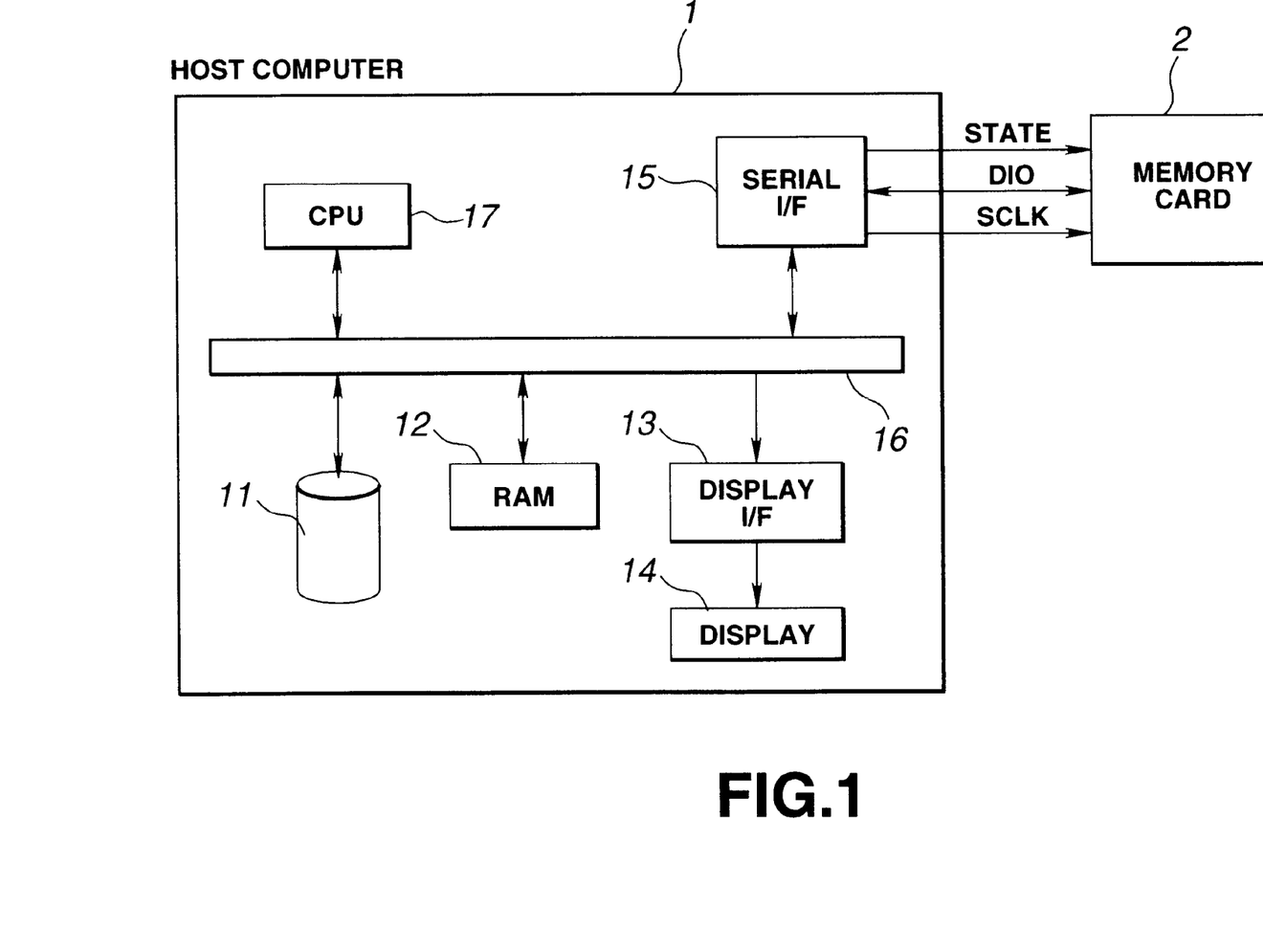
FIG. 1 is a block diagram showing a configuration of a host computer which transmits a data to a memory card.

Here, explanation will be given on a case when the memory card as an example stores a data from a host computer 1 as shown in FIG. 1. Moreover, explanation will be given on a video data which is transmitted from the host computer is written in the memory card, but the present invention can also be applied to an audio data and other data.

As shown in FIG. 1, the host computer 1 includes: a hard disc 11 for storing a video data of a still image and an audio data; RAM (random access memory) for temporarily storing a video data and the like from the hard disc 11 and reading out the data; a display interface (hereinafter, referred to as a display I/F) 13; a display 14 for displaying an image according to the video data supplied via the display I/F 13; a serial interface (hereinafter, referred to as a serial I/F) for transmitting and receiving a data via three data lines to/from the memory card 2; a bus 16; and a CPU (central processing unit) 17 for executing the overall control.

The RAM 12, for example, temporarily stores via the bus 16 an audio data and a video data stored in the hard disc 11 and supplies the video data when necessary via the bus 16 to the serial I/F 15.

The display 14 is supplied via the bus 16 and the display I/F 13 with a video data read out from the hard disc 11 and with a video data from the memory card 2, and displays a still image according to these video data.

The serial I/F 15 transmits a video data via the three data lines to the memory card 2 and receives a video data stored in the memory card. More specifically, via a first data line, the serial I/F 15 transmits a video data to be written in the memory card 2 and a control data and receives a video data which has been read out from the memory card 2. The serial I/F 15, via a second data line, according to switching between a video data and a control data in the first data line, outputs a status signal indicating the switched state. Furthermore, via a third data line, the serial I/F 15 transmits a serial clock SCLK for transmission of the aforementioned control data and video data.

The CPU 17 controls read-out of a video data from the RAM 12 and the hard disc 11 and write-in of a video data in the RAM 12 as well as transmission and reception of a video data and the like to/from the memory card 2. For example, the CPU 17 specifies an address in the card memory 2 and issues a write instruction of a predetermined data.

Figure 2:
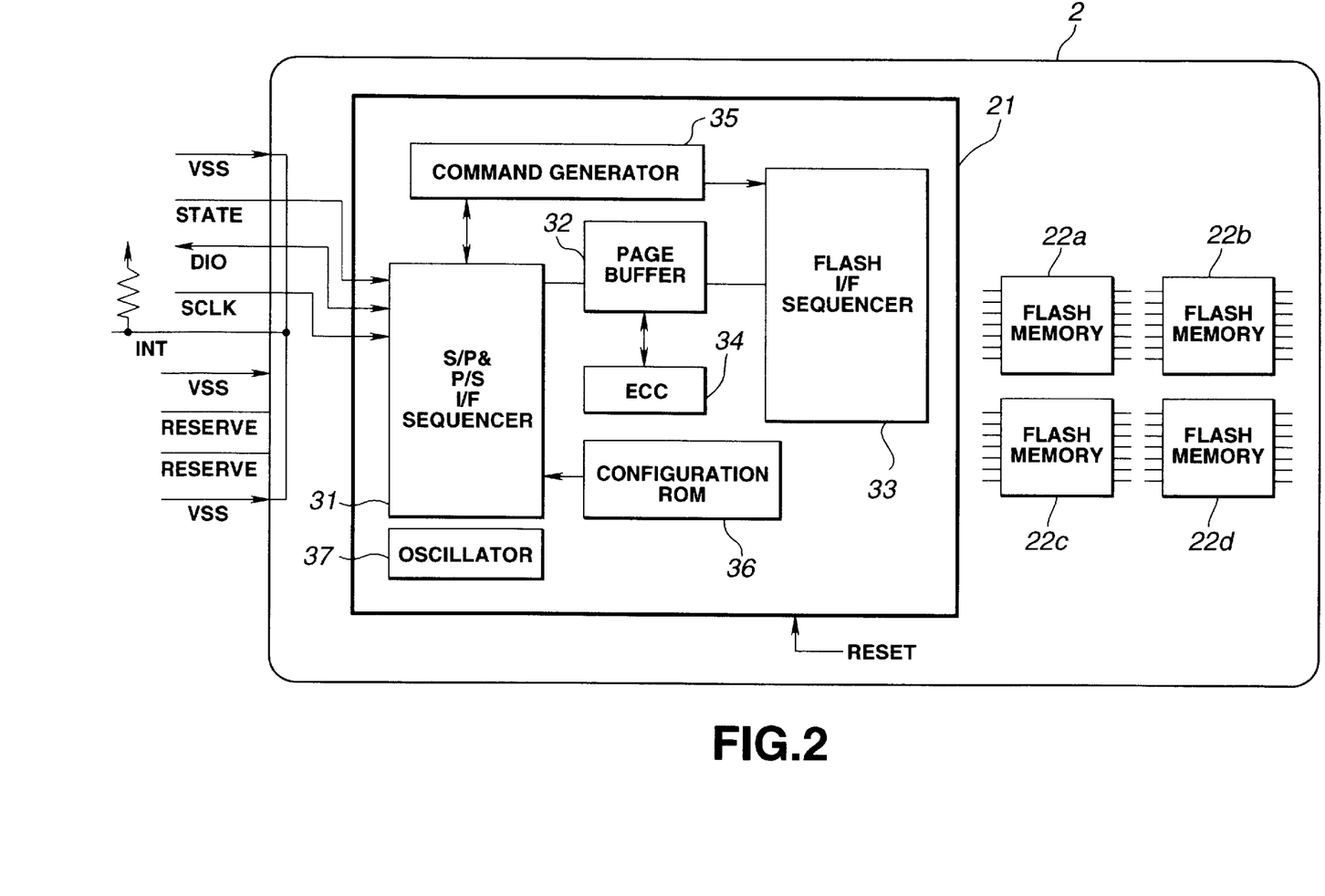
FIG. 2 is a block diagram showing a configuration of a memory card.

FIG. 2 shows the memory card 2 of the present example including: a control IC 21 for receiving a video data and a control data from the aforementioned host computer; and a flash memory (electrically erasable programmable ROM (read only memory)) 22 which is storage means (hereinafter, referred to as memory) for storing the video data received.

The control IC 21, more specifically, includes: a serial/parallel—parallel/serial interface sequencer (hereinafter, referred to as S/P & P/S sequencer) 31; a page buffer 32 for temporarily storing a video data from the S/P & P/S sequencer; a flash interface sequencer (hereinafter, referred to as flash I/F sequencer) 33 for supplying a video data from the page buffer 32, to the flash memory 22; an ECC encoder/decoder 34 for executing an error correction processing; a command generator 35 for generating a predetermined control command; a configuration ROM (read only memory) 36 for storing a version information and the like; and an oscillator 37 fro supplying a clock to respective circuits.

The S/P & P/S sequencer 31 is connected via the aforementioned first to third data lines to the serial I/F 15 of the host computer 1. Consequently, the S/P & P/S sequencer 31 is supplied with a status signal and a serial clock SCLK as well as a serial DIO consisting of a video data and a control data from the host computer 1.

The S/P & P/S sequencer 31 converts the serial data DIO supplied from the host computer 1, into a parallel data in synchronization with the aforementioned serial clock CSLK. Among the parallel data, the S/P & P/S sequencer 31 supplies, for example, a control data to the command generator 35 and a video data to the page buffer 32.

The page buffer 32 is a buffer memory for storing a video data supplied from the S/P & P/S sequencer 31, for each one page (+512 bytes). The video data stored in the page buffer 32 is added with an error correction code by the ECC encoder/decoder 34. The page buffer 32 supplies one page of video data via the flash I/F sequencer 33 to the flash memories 22a to 22d. Thus, the video data from the host computer 1 is written in the flash memories 22a to 22d.

Moreover, the video data read out from the flash memories 22a to 22d is supplied via the flash I/F sequencer 33 to the page buffer 32.

The page buffer 32 stores the video data from the flash I/F sequencer 33. Here, the ECC encoder/decoder 34 executes an error correction processing according to the error correction code added to the data stored in the page buffer 32. The page buffer 32 reads out page after another of the data which has been subjected to the error correction processing and supplies the data to the S/P & P/S sequencer 31. The S/P & P/S sequencer 31 converts the parallel video data supplied from the page buffer 32, into a serial data DIO and transmits the data to the aforementioned host computer 1.

The command generator 35 generates a control command according to a control data from the S/P & P/S sequencer 31. Moreover, the command generator 35 generates a Busy command (hereinafter, referred to as a busy signal) indicating a video data write in the flash memory 22 or a video data read-out from the flash memory 22, and transmits the signal via the S/P & P/S sequencer 31 to the host computer 1. When the video data write-in or the data read-out is complete, the command generator 35 generates a Ready command (hereinafter, referred to as a ready signal) indicating the end and transmits the signal via the S/P & P/S sequencer 31 to the host computer 1. The host computer 1 recognizes the operation state of the memory card 2 by receiving these busy and ready signals.

The configuration ROM 36 contains a version information and an initial value information of the memory card 2. Consequently, when a connection is made between the host computer 1 and the memory card 2, the command generator 35 firstly reads out the aforementioned version information from the configuration ROM 36 via the S/P & P/S sequencer 31, and according to this information, generates a predetermined command, thus executing a predetermined initialization of the memory card 2.

In the memory card 2 of this example, the flash memory 22 used as a memory is a flash memory of NAND type. This NAND type flash memory has a redundant area besides a data area for each page.

Figure 3A:
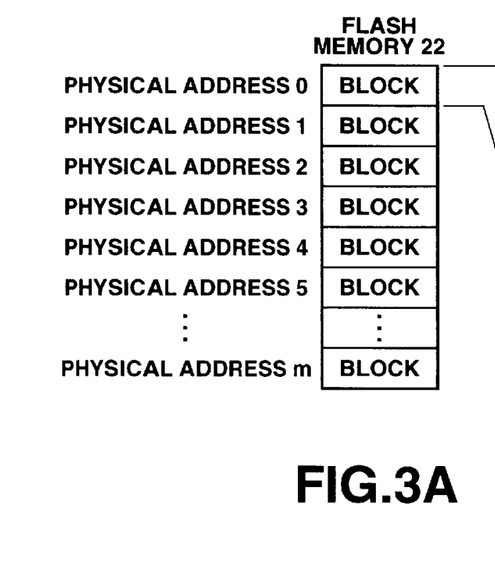
FIG. 3 shows a storage area configuration of the memory card.
Figures 3B, 3C:
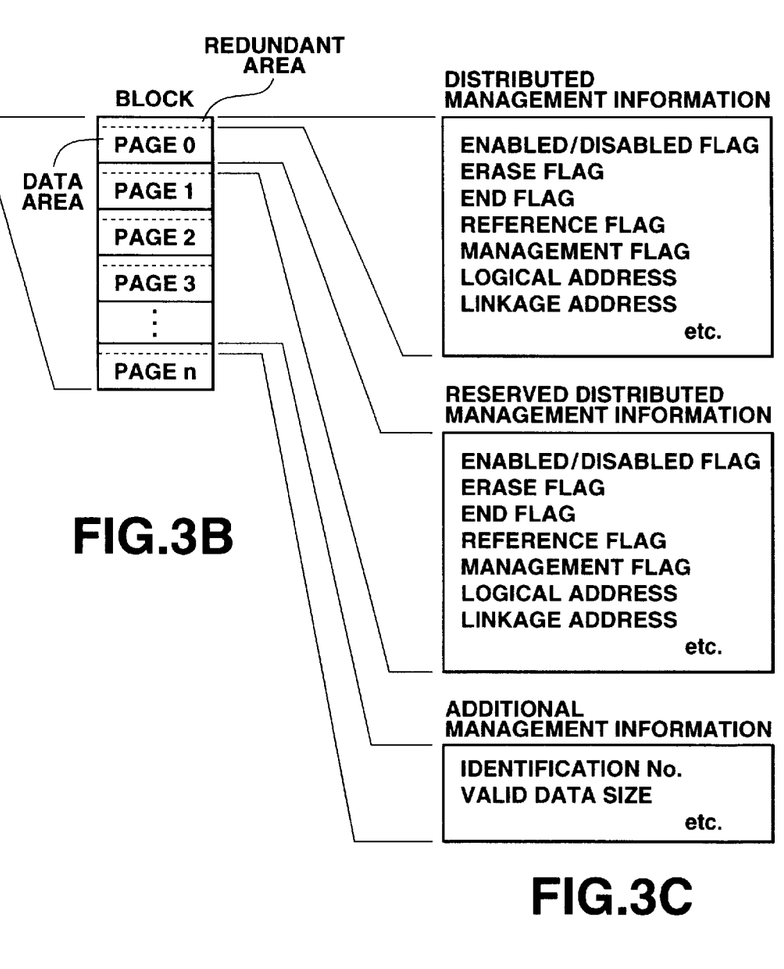

Accordingly, the memory card 2 in the present embodiment has a configuration of the flash memory 22 as follows. That is, the flash memory 22 has a storage area which is divided into a plurality of blocks as shown in FIG. 3A. Each of these blocks, as shown in FIG. 3B, consists of a plurality of pages which serves as the data write and read unit. Each of the pages is divided into a data area for storing a data and a redundant area for storing an information required for management of the data stored in the data area.

As shown in FIG. 3C, a redundant area of a head page of a block contains a distributed management information required for management of the block. Moreover, the redundant areas of the respective pages after the first page of the block also contain, as a reserved distributed management information, the same distributed management information stored in the redundant area of the head page. However, the redundant area of the last page, instead of the distributed management information, contains an additional information which is out of the distributed management information.

It should be noted that in this flash memory 22, in the initial state a data of all "1" is written which can only be changed to "0". That is, during a data write, "0" is written into a part of the data. When erasing a data which has been written, initialization is carried out on block basis so as to erase the data written in the block all at once. When this initialization processing is carried out, the block again enters a data writable state.

As shown in FIG. 3C, as the distributed management information, there is stored a logical address used for block specification, an erase flag indicating the block use state, an end flag indicating whether the last block of a continuous data of a predetermined unit (such as a file), and the like.

More specifically, one byte is assigned for the erase flag in the overwrite area of the respective blocks of the memory card 2, and in this overwrite area, it is possible to change only from "1" to "0".

For example, an initial state of a block where no data is written is indicated by "1111 1111". When a data is written in the block and a data head of a predetermined unit such as one file, i.e., an in-use state as a head block is indicated by "1111 0000" by changing the second 4 digits to zero. Moreover, when an intermediate data of a predetermined unit such as one file is stored, the in-use state of intermediate data is indicated by "0000 1111" by changing the first 4 digits to zero.

In the initial state, each of the blocks contains no data and has an erase flag of "1111 1111". When the host computer 1 has written, for example, a video data in predetermined blocks, the erase flags of the respective block are overwritten in the first or the second 4 digits such as "1111 0000" if used as the head block or "0000 1111" if used as other than the head block.

Furthermore, one byte is used for an end flag which indicates an end block containing an end portion of a data of a predetermined unit such as a file in the overwirte area of respective blocks of the memory card 2. Here also, it is possible to change only from "1" to "0".

If a block does not contain an end of a data of a predetermined unit such as a file and has a following block which is not the end block, then the block is indicated by "1111 xxxx" (xxxx is used as a flag for other purpose). If a block contains an end of a data of a predetermined unit and has no following block, i.e., if the block is a final block, the block is indicated by "0000 xxxx" (xxxx is used as a flag for other purpose).

When using the memory card of this example, according to the memory management method of the present invention, the host computer 1 executes a processing as follows. For example, it is assumed that the host computer 1 has set a video data write state and a data of predetermined blocks has become unnecessary.

As has been described above, the memory card of this example erases the data contained in the aforementioned blocks all at once by the initialization processing on block basis, so as make the blocks again in a data writable state.

Figure 4:
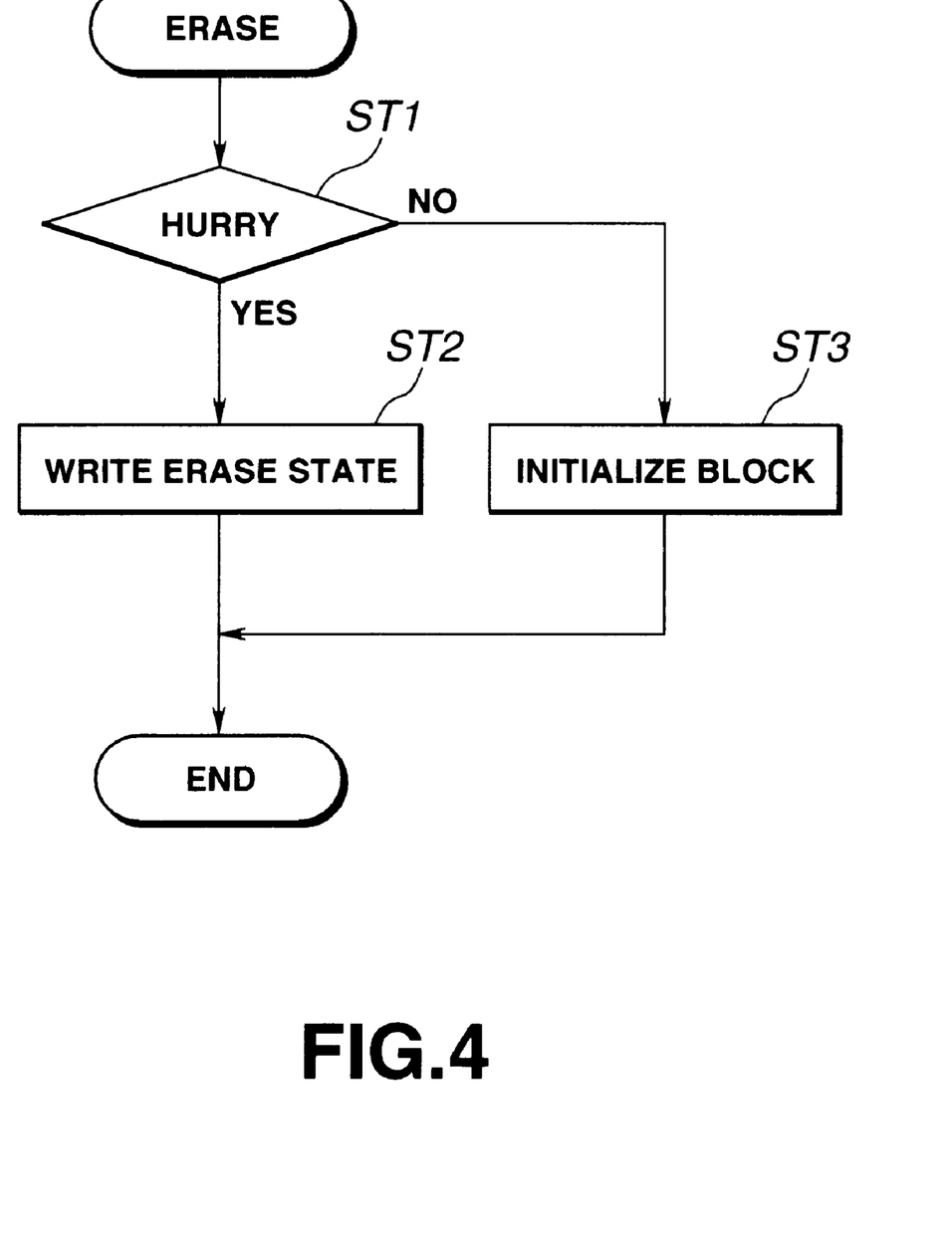
FIG. 4 is a flowchart showing an erase processing.

Consequently, the aforementioned host computer 1, as shown in FIG. 4, tries to execute an initialization processing for the blocks containing a data which is unnecessary.

Here, as has been described above, a video data write is to be carried out. If the initialization of the aforementioned blocks is executed in advance, the time required for the entire processing becomes quite long. To cope with this, in the host computer 1, as shown in FIG. 4, when executing an erase, it is determined in step ST1 whether the processing should be executed in a hurry. Here, in the case of YES (hurry), control is passed to step ST2 where the erase flags of "1111 0000" or "0000 1111" of the blocks containing an unnecessary data are overwritten in the "1111" portion into zero so as to be "0000 0000" and an erase state indicating the data to be erased is written, terminating the erase temporarily.

Figure 5:
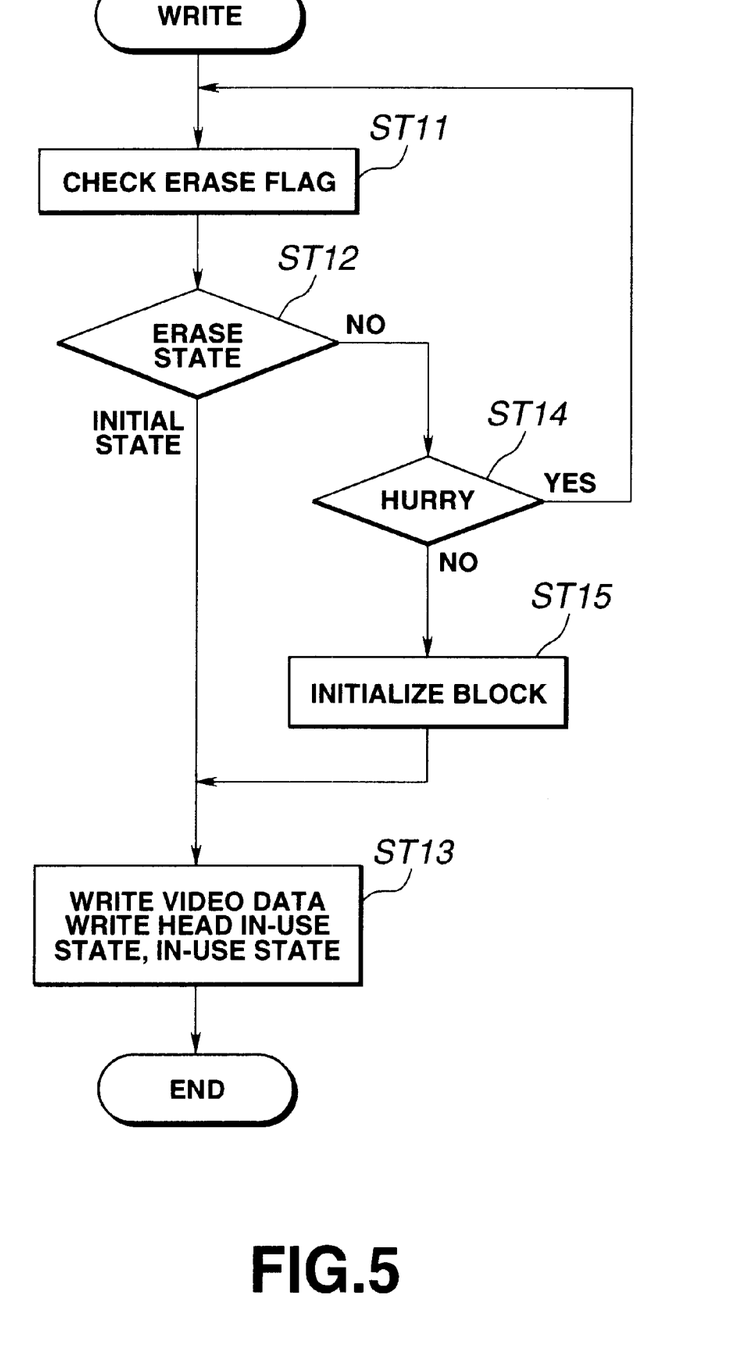
FIG. 5 is a flowchart showing a data write processing.

Next, as shown in FIG. 5, a video data is written. In step ST11, the host computer 1 firstly checks the erase flags of respective blocks successively in the flash memory 22 of the memory card 2. In step ST12, it is determined that an erase flag of a selected block is in the initial state or in the erase state. If in the initial state, control is passed to ST13 where the host computer 1 writes a video data in the block and the in-use state of head or simply the in-use state in the erase flag. More specifically, host computer 1 executes overwrite to change the erase flag "1111 1111" of the initial state into "1111 0000" indicating the in-use state of head or "0000 1111" indicating the in-use state. Thus, the video data write processing is complete.

On the other hand, if the erase state is identified in step ST12, control is passed to step ST14 where the host computer 1 determined whether to execute the data write processing in a hurry. If the data write processing to be executed in a hurry (Yes), control is returned to step ST1l where the host computer 1 checks the erase flags successively. This processing is repeated until an erase flag of the initial state is found. When an erase flag of the initial state is found, the aforementioned video data write processing is carried out.

After the aforementioned video data write processing is complete, the host computer 1 executes a in initialization processing of the blocks having the erase flag set to the erase state during the erase processing, thus erasing the data of the blocks all at once, so as to make these blocks into a data writable state. In this process, the erase flags of these blocks are initialized.

That is, according to the aforementioned memory management of the present invention, in a case when a processing other than initialization is to be carried out to predetermined blocks containing a data which has become unnecessary, firstly, without executing the initialization of the blocks, the erase flags of the blocks are set to the erase state indicating the data contained in the blocks is to be erased, and in this state the processing other than the initialization is executed to the blocks containing the unnecessary data, and then the initialization processing is executed to the blacks having the erase flag in the erase state, prior to writing a data, and the flags of these blocks are set to the initial state. Thus, various processing can be executed without waiting for completion of the initialization which requires a plenty of time, thus enabling a high-speed processing.

Moreover, according to the memory management of the present invention, the host computer 1 need not hurry to execute an initialization processing to the erase flags in the erase state. It is possible to execute the initialization when there is comparatively small amount of processing to be executed by the host computer, i.e., to execute the initialization which requires a plenty of time in an empty time, thus enabling to execute an effective processing.

Moreover, in this embodiment, the blocks which has been in use state of head or use state at the erase processing have the erase flag which is rewritten to the erase state, thus enabling to distinguish these blocks from blocks in which a new data is written. As shown in FIG. 5, if a block is in the erase state (Yes) in step ST12 and if not in a hurry (No) in step ST14, it is possible to pass control to step ST15 where the host computer 1 executes the initialization processing only to the blocks having the erase flag in the erase state.

Furthermore, if the host computer 1 need not execute a processing other than the initialization processing to blocks containing an unnecessary data, in the same way as in a conventional procedure, even after the check in step ST1, control is passed to step ST3 where the initialization processing is executed to the blocks so as to initialize the blocks and their erase flags into the initial state.

Moreover, in this embodiment, when a video data is to bet written by the host computer 1 as has been described above, it is necessary to identify the end block containing the end portion of a predetermined unit such as a file, and when a data is written by the host computer 1 to the block which is to become the end block, the end flag indicating whether the block is an end block is rewritten into "0000 xxxx".

However, in a case such as a music when it is impossible to decide which block is the end block while writing a data, it is impossible to write the end flag during a data write.

In such a case, according to the memory management method of the present invention, during the data write, the end flag is set to "1111 xxxx" which indicates that no end portion of a data of a predetermined unit is stored and there is a subsequent block, i.e., the block is not an end block, and when the end portion of the data of the predetermined unit is written in the block and the block has become the end block, the erase flag is overwritten by "0000 xxxx" which indicates that an end portion of a data of a predetermined unit is stored and there is no subsequent block, i.e., the block is an end block.

In the memory card of the present embodiment, the overwrite area is provided with a flag indicating whether the block is an end block containing the end portion of the data of a predetermined unit, and accordingly, there is no need of transferring a data to a buffer or the like at the moment when the end block is identified for rewriting a data in this block together with the flag indicating the end block. This enables to realize a high-speed processing.

Figure 6:
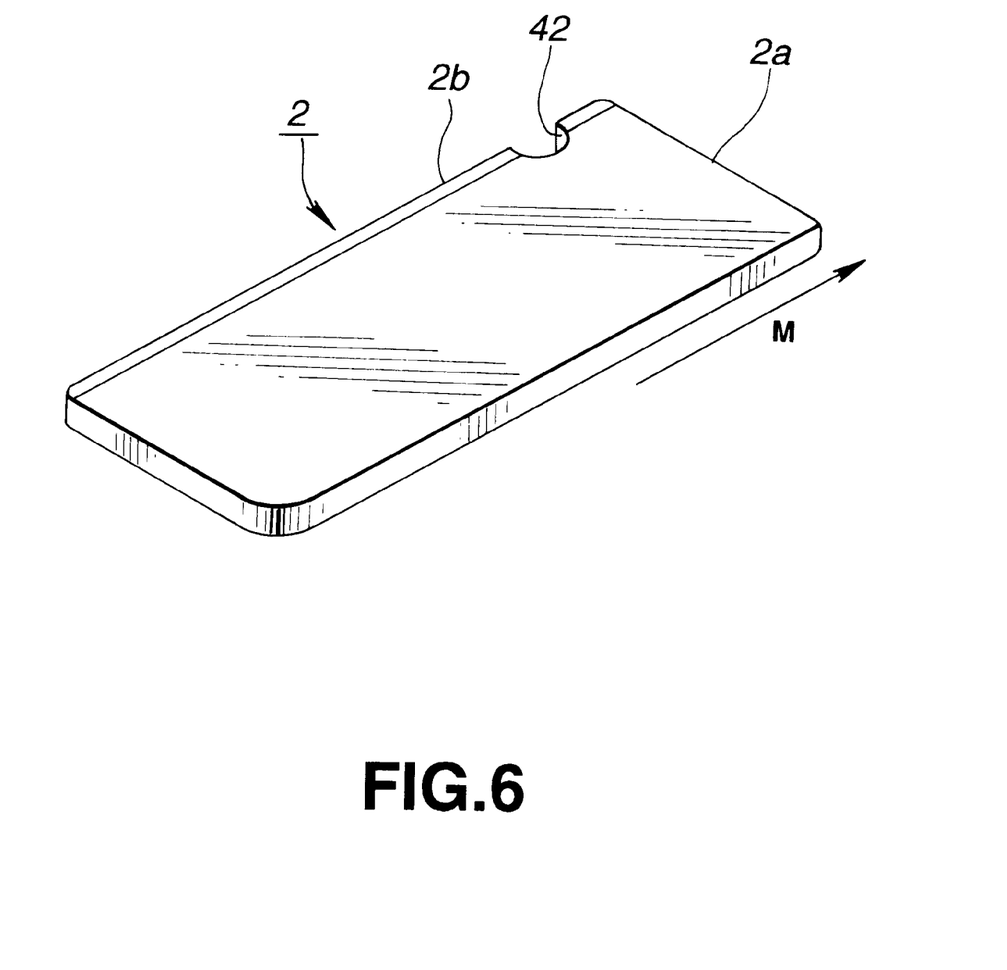
FIG. 6 is a perspective view showing the memory card.

It should be noted that the memory card 2 in this embodiment may have an external configuration which is a in card shape having a rectangular plane made from a synthetic resin, for example, as shown in FIG. 6.

In the aforementioned memory card 2, there is provided an external terminal (not depicted) at one end 2a in the longitudinal direction, for example, so that the memory card 2 is mounted on an electronic apparatus (not depicted) by inserting this end 2a in the direction indicated by M in the figure.

Moreover, the aforementioned memory card 2 may have a lock cut-off portion 42 formed at one side 2b parallel to the mounting direction, for example, so as to be engaged with a lock convex of an electronic apparatus (not depicted) when the memory card 2 is mounted on the electronic apparatus, thus preventing removal of the memory card 2 from the electronic apparatus.

It should be noted that in the aforementioned embodiment, the memory card for serial interface is explained, but the present invention can also be applied to a memory management method of a memory for a parallel interface.

What is claimed is:

1. A memory card being connectable to an electronic apparatus to receive data therefrom, comprising:

a memory divided into a plurality of blocks, each of said plurality of blocks being divided into a plurality of pages, each of said plurality of pages being divided into a data area and a redundant area, data stored in said data area of each of said plurality of pages of one of said plurality of blocks being erased at once when said one of said plurality of blocks is initialized, a flag being stored in said redundant area in at least one of said plurality of pages in one of said plurality of blocks indicating the state of said one of said plurality of blocks, wherein said flag stored in said redundant area in said at least one of said plurality of pages in said one of said plurality of blocks has a second state indicating that data stored in said one of said plurality of blocks is to be erased when said one of said plurality of blocks is initialized and a first state indicating that the said one of said plurality of blocks has been initialized.

2. The memory card as claimed in claim 1, wherein when data contained in one of said plurality of blocks is to be erased, the flag in said redundant area of said at least one of said plurality of pages of said one of said plurality of blocks is set to an erase state indicating that the data of the said one of said plurality of blocks is to be erased.

3. An electronic apparatus for writing data to a memory in a memory card connected thereto, said memory being divided into a plurality of blocks, wherein all of the data written to each of said plurality of blocks is erased at once when each of said plurality of blocks is initialized, said electronic apparatus comprising:

an interface circuit for interfacing said electronic apparatus with said memory card; and control means for controlling the operation of said electronic apparatus;

wherein said control means utilizes said memory by dividing each of said plurality of blocks into a plurality of pages, each of said plurality of pages being divided into a data area and a redundant area, storing a flag indicating the state of one of said plurality of blocks in said redundant area of at least one of said plurality of pages of each of said plurality of said blocks, changing said flag stored in said redundant area of said at least one of said plurality of pages of one of said plurality of blocks into a second state indicating that data stored in said one of said plurality of blocks is to be erased when an instruction is given to initialize said data stored in said one of said plurality of blocks, initializing said one of said plurality of blocks prior to writing data to said one of said plurality of blocks having said flag stored in said redundant area of said at least one of said plurality of pages of said one of said plurality of blocks set in said second state, and changing said flag stored in said redundant area of said at least one of said plurality of pages of said one of said plurality of blocks into a first state indicating that the said one of said plurality of blocks has been initialized.

4. The apparatus as claimed in claim 3, wherein when data is being written to each of said plurality of blocks, the flag of each of said plurality of blocks in the first state is set either to a beginning in-use state indicating that a beginning portion of data of a predetermined unit is stored, or to an in-use state indicating that an intermediate portion of data of a predetermined unit is stored.

5. The apparatus as claimed in claim 3, wherein each of said plurality of blocks is provided with an end flag indicating whether the block is an end block containing an end portion of data of a predetermined unit; and when data is being written, the end flag of each of said plurality of blocks where an end portion of the data of the predetermined unit is written is set to a state indicating an end block.

6. A method for managing the writing of data to a memory in a memory card connected to an electronic apparatus, said memory being divided into a plurality of blocks, all of the data in each of said plurality of blocks being erased at once when said block is initialized, said method comprising the steps of:

dividing each of said plurality of blocks into a plurality of pages;

dividing each of said plurality of pages into a data area and a redundant area;

storing a flag indicating the state of said block in said redundant area in at least one of said plurality of pages in each of said plurality of blocks;

changing said flag in said redundant area of at least one of said plurality of pages of one of said plurality of blocks from a first state into a second state indicating that data stored in all of the data areas in all of said plurality of pages of said one of said plurality of blocks is to be erased when said data stored in said one of said plurality of blocks is instructed to be initialized; and initializing said one of said plurality of blocks prior to writing data to said block when said flag in said redundant area of at least one of said plurality of pages of said one of said plurality of blocks is in said second state, and changing said flag in said redundant area of at least one of said plurality of pages of said one of said plurality of blocks back to said first state indicating that said one of said plurality of blocks has been initialized.

7. The method as claimed in claim 6, wherein when data is being written to one of said plurality of blocks, the flag of said one of said plurality of blocks in the first state is set to either a beginning in-use state indicating the storage of a beginning portion of data of a predetermined unit, or an in-use state indicating the storage of an intermediate portion of data of a predetermined unit.

8. The memory management method as claimed in claim 6, wherein in each of said plurality of blocks, there is provided an end flag indicating whether the block is an end block containing an end portion of data of a predetermined unit; and when data is being written, the end flag of each of said plurality of blocks where an end portion of the data of the predetermined unit is written is set to a state indicating an end block.

* * * * *